(12) United States Patent
Choi et al.

(10) Patent No.: US 10,332,951 B2
(45) Date of Patent: Jun. 25, 2019

(54) DISPLAY DEVICE WHICH PREVENTS PARASITIC CAPACITANCE AND A DROP IN DRIVING

(71) Applicant: Samsung Display Co., Ltd., Yongin-si, Gyeonggi-do (KR)

(72) Inventors: Junwon Choi, Yongin-si (KR); Changsoo Pyon, Yongin-si (KR)

(73) Assignee: Samsung Display Co., Ltd. (KR)

( * ) Notice: Subject to any disclaimer, the term of this patent is extended or adjusted under 35 U.S.C. 154(b) by 61 days.

(21) Appl. No.: 15/593,671

(22) Filed: May 12, 2017

(65) Prior Publication Data

US 2017/0330928 A1    Nov. 16, 2017

(30) Foreign Application Priority Data

May 16, 2016    (KR) .......................... 10-2016-0059773

(51) Int. Cl.
*H01L 29/08*    (2006.01)
*H01L 27/32*    (2006.01)
*H01L 27/12*    (2006.01)

(52) U.S. Cl.
CPC ........ *H01L 27/3272* (2013.01); *H01L 27/124* (2013.01); *H01L 27/1255* (2013.01); *H01L 27/3276* (2013.01)

(58) Field of Classification Search
CPC .................................................. H01L 27/3272
USPC .......................................................... 257/40
See application file for complete search history.

(56) References Cited

U.S. PATENT DOCUMENTS

| 6,531,993 | B1 * | 3/2003 | Yamazaki | ........... G02F 1/13454 |
| | | | | 257/347 |
| 7,394,446 | B2 | 7/2008 | Park | |
| 8,822,987 | B2 | 9/2014 | Fujita et al. | |
| 2005/0088596 | A1 * | 4/2005 | Shimizu | ................ G02F 1/1362 |
| | | | | 349/139 |
| 2006/0132055 | A1 | 6/2006 | Kwak | |
| 2008/0265785 | A1 * | 10/2008 | Kim | ..................... G09G 3/3225 |
| | | | | 315/169.3 |
| 2008/0286914 | A1 * | 11/2008 | Makimura | .......... G02F 1/13454 |
| | | | | 438/166 |
| 2010/0182303 | A1 | 7/2010 | Takasugi et al. | |

(Continued)

FOREIGN PATENT DOCUMENTS

KR    10-2006-0065083 A    6/2006
KR    10-0642491 B1    11/2006

(Continued)

*Primary Examiner* — Caleb E Henry
(74) *Attorney, Agent, or Firm* — Innovation Counsel LLP

(57) ABSTRACT

A display device includes a plurality of pixels, wherein a first pixel of the plurality of pixels includes: a scan line extending in a first direction; a data line and a driving voltage line extending in a second direction crossing the first direction; a switching thin film transistor connected to the scan line and the data line; a driving thin film transistor connected to the switching thin film transistor; a first shielding layer overlapping the data line; and a second shielding layer overlapping the data line, the second shielding layer being spaced apart from the first shielding layer in the second direction such that the first shielding layer and the second shielding layer are spaced apart a predetermined distance apart from each other.

18 Claims, 10 Drawing Sheets

(56) References Cited

U.S. PATENT DOCUMENTS

2016/0043159 A1\* 2/2016 Kim .................... H01L 27/3262
　　　　　　　　　　　　　　　　　　　　　　　 257/71
2016/0275857 A1　 9/2016 Pyon et al.
2017/0330928 A1\* 11/2017 Choi .................... H01L 27/124

FOREIGN PATENT DOCUMENTS

KR　　　　10-1103615 B1　　1/2012
KR　　10-2016-0113376 A　　9/2016

\* cited by examiner

DISPLAY DEVICE WHICH PREVENTS PARASITIC CAPACITANCE AND A DROP IN DRIVING

CROSS-REFERENCE TO RELATED APPLICATION

This application claims the benefit of Korean Patent Application No. 10-2016-0059773, filed on May 16, 2016, in the Korean Intellectual Property Office, the disclosure of which is incorporated herein in its entirety by reference.

BACKGROUND

1. Field

One or more embodiments relate to a display device.

2. Description of the Related Art

Generally, a display device includes a display element and electronic elements for controlling an electric signal applied to the display element. The electronic elements include a thin film transistor (TFT), a storage capacitor, and a plurality of wirings.

To accurately control light emitted by a display element and an emission degree, a number of TFTs electrically connected to one display element has increased and the number of wirings transferring an electric signal to the TFTs has also increased.

SUMMARY

According to a display device of a related art, as intervals between elements of a thin film transistor (TFT) and/or wirings of the display device are reduced for the purpose of implementing a miniaturized or high resolution display device, parasitic capacitance of a driving TFT increases.

One or more embodiments include a display device which prevents the occurrence of parasitic capacitance and prevents a drop in driving voltage. However, the above embodiment is merely provided as an example, and the scope of the disclosure is not limited thereto.

Additional aspects will be set forth in part in the description which follows and, in part, will be apparent from the description, or may be learned by practice of the presented embodiments.

According to one or more embodiments, a display device includes a plurality of pixels, wherein a first pixel of the plurality of pixels includes: a scan line extending in a first direction; a data line and a driving voltage line extending in a second direction crossing the first direction; a switching thin film transistor connected to the scan line and the data line; a driving thin film transistor connected to the switching thin film transistor; a first shielding layer overlapping the data line; and a second shielding layer overlapping the data line, the second shielding layer being spaced apart from the first shielding layer in the second direction such that the first shielding layer and the second shielding layer are spaced a predetermined distance apart from each other.

The first shielding layer and the second shielding layer may be electrically connected to a wiring of a constant voltage.

One of the first shielding layer and the second shielding layer may be electrically connected to the driving voltage line of the first pixel, and the other of the first shielding layer and the second shielding layer may be electrically connected to a driving voltage line of a second pixel adjacent to the first pixel.

The first shielding layer and the second shielding layer may include a same material.

The first shielding layer and the second shielding layer may be disposed below the data line with at least one insulating layer between the data line and the first shielding layer and the second shielding layer.

The driving thin film transistor may include: a driving semiconductor layer including a driving channel region, and a driving source region and a driving drain region each respectively disposed at opposite sides of the driving channel region; and a driving gate electrode overlapping the driving channel region.

The first shielding layer and the second shielding layer may overlap a portion of the data line adjacent to the driving gate electrode.

The first shielding layer and the second shielding layer may include a same material as those of the driving source region and the driving drain region.

The first shielding layer and the second shielding layer may be polycrystalline silicon layers doped with impurities.

The display device may further include: a connection line disposed between the first shielding layer and the second shielding layer, the connection line electrically connecting the driving voltage line of the first pixel to a driving voltage line of a second pixel adjacent to the first pixel.

The connection line may be disposed below the data line with at least one insulating layer between the data line and the connection line.

The connection line may not overlap the first shielding layer and the second shielding layer.

The first pixel may further include: a storage capacitor including a first electrode and a second electrode overlapping each other with an insulating layer disposed between the first electrode and the second electrode.

The connection line may include a same material as that of at least one of a driving gate electrode of the driving thin film transistor and the first electrode.

The second electrode may be disposed between the driving voltage line and the connection line such that one side of the second electrode is connected to the driving voltage line and the other side of the second electrode is connected to the connection line.

The driving voltage line and the second electrode may be provided as one body.

The predetermined distance may be greater than a width of the connection line.

The first pixel may include an organic light-emitting diode electrically connected to the driving thin film transistor.

A display device according to embodiments may prevent or reduce a crosstalk by signal change of a data line and provide a high quality image by preventing a voltage drop of a driving voltage line. The scope of the embodiments is not limited by this effect.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
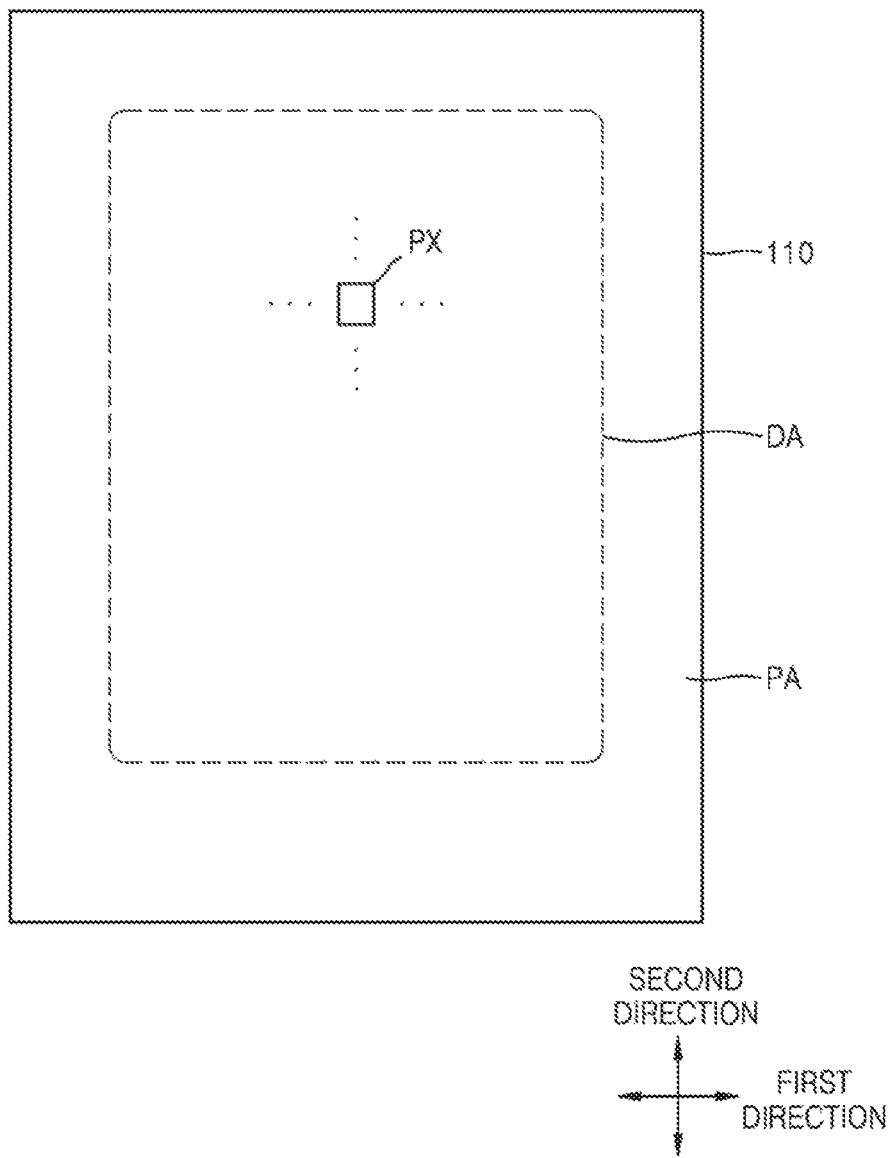
FIG. 1 is a plan view of a display device according to an embodiment.

As the disclosure allows for various changes and numerous embodiments, embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the embodiments set forth herein.

Hereinafter, the disclosure will be described more fully with reference to the accompanying drawings, in which exemplary embodiments of the disclosure are shown. When description is made with reference to the drawings, like reference numerals in the drawings denote like or corresponding elements, and repeated description thereof will be omitted.

As used herein, the term "and/or" includes any and all combinations of one or more of the associated listed items.

Expressions such as "at least one of" when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

FIG. 1 is a plan view of a display device according to an embodiment.

Referring to FIG. 1, the display device includes a substrate 110. The substrate 110 includes a display area DA and a peripheral area PA outside the display area DA.

Pixels PX having various display elements such as an organic light-emitting diode (OLED) may be arranged in the display area DA. Various wirings transferring an electric signal to be applied to the display area DA may be arranged in the peripheral area PA of the substrate 110. Hereinafter, for convenience of description, a display device having an OLED as a display element is described. However, an embodiment is not limited thereto.

Figure 2:
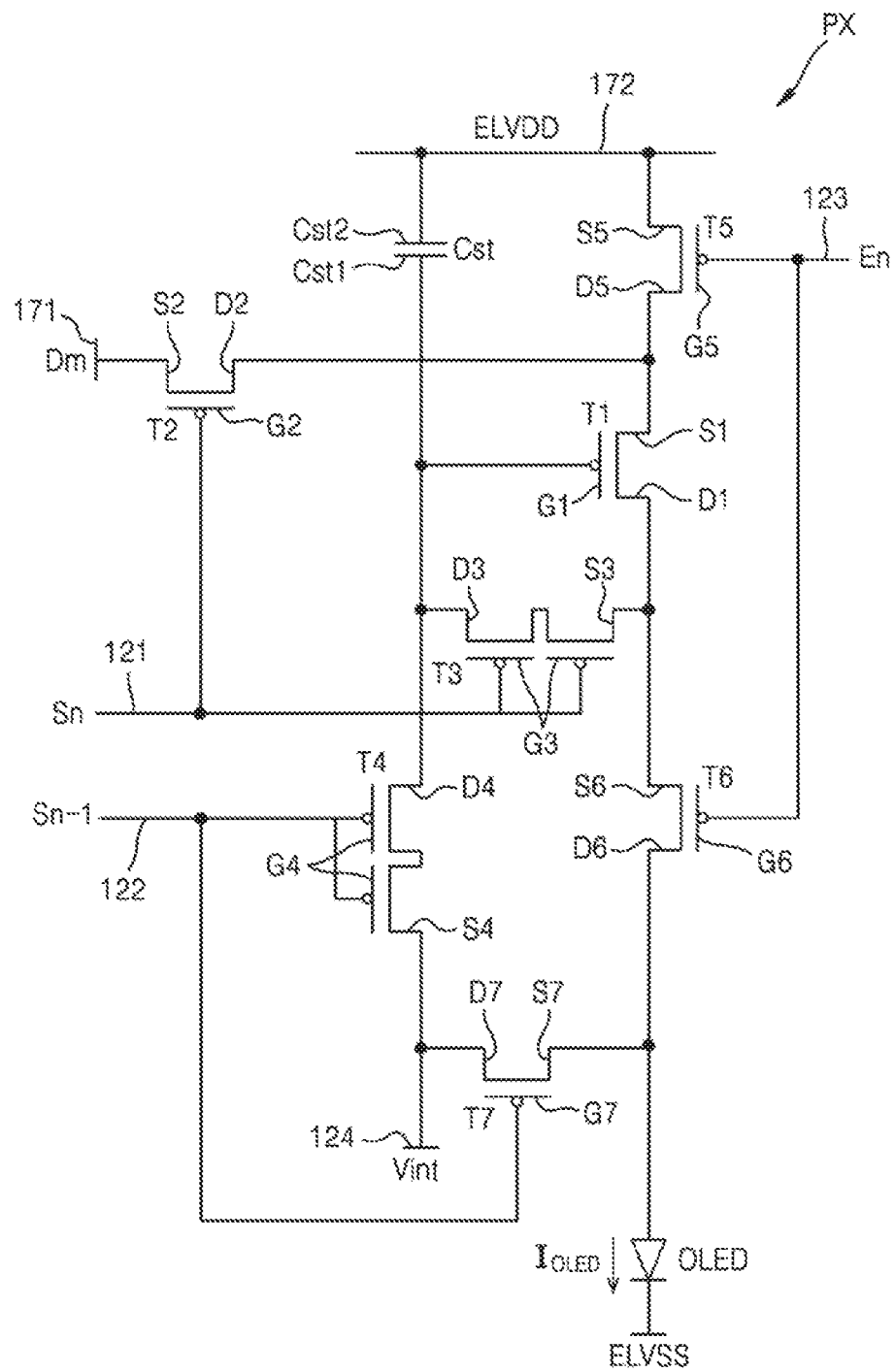
FIG. 2 is an equivalent circuit diagram of one pixel of the display device of FIG. 1.

FIG. 2 is an equivalent circuit diagram of one pixel of the display device of FIG. 1.

Referring to FIG. 2, a pixel PX includes a plurality of thin film transistors (TFTs) connected to signal lines 121, 122, 123, and 171, a storage capacitor Cst, an initialization voltage line 124, a driving voltage line 172, and an OLED.

Although FIG. 2 illustrates that each pixel PX includes the signal lines 121, 122, 123, and 171, the initialization voltage line 124, and the driving voltage line 172, an embodiment is not limited thereto. In another embodiment, at least one of the signal lines 121, 122, 123, and 171, and/or the initialization voltage line 124 may be shared by adjacent pixels.

The TFTs may include a driving TFT T1, a switching TFT T2, a compensation TFT T3, a first initialization TFT T4, an operation control TFT T5, an emission control TFT T6, and a second initialization TFT T7.

The signal lines include the scan line 121 transferring a scan signal Sn, the previous scan line 122 transferring a previous scan signal Sn−1 to the first initialization TFT T4 and the second initialization TFT T7, the emission control line 123 transferring an emission control signal En to the operation control TFT T5 and the emission control TFT T6, and the data line 171 crossing the scan line 121 and transferring a data signal Dm. The driving voltage line 172 transfers a driving voltage ELVDD to the driving TFT T1, and the initialization voltage line 124 transfers an initialization voltage Vint initializing the driving TFT T1 and a pixel electrode.

A driving gate electrode G1 of the driving TFT T1 is connected to a first storage plate Cst1 of the storage capacitor Cst, a driving source electrode S1 of the driving TFT T1 is connected to the driving voltage line 172 via the operation control TFT T5, and a driving drain electrode D1 of the driving TFT T1 is electrically connected to the pixel electrode of the OLED via the emission control TFT T6. The driving TFT T1 receives a data signal Dm in response to a switching operation of the switching TFT T2 and supplies a driving current $I_{OLED}$ to the OLED.

A switching gate electrode G2 of the switching TFT T2 is connected to the scan line 121, a switching source electrode S2 of the switching TFT T2 is connected to the data line 171, and a switching drain electrode D2 of the switching TFT T2 is connected to the driving source electrode S1 of the driving TFT T1 and simultaneously connected to the driving voltage line 172 via the operation control TFT T5. The switching TFT T2 is turned on in response to a scan signal Sn transferred via the scan line 121 and performs a switching operation of transferring a data signal Dm transferred via the data line 171 to the driving source electrode S1 of the driving TFT T1.

A compensation gate electrode G3 of the compensation TFT T3 is connected to the scan line 121, a compensation source electrode S3 of the compensation TFT T3 is connected to the driving drain electrode D1 of the driving TFT T1 and simultaneously connected to the pixel electrode of the OLED via the emission control TFT T6, and a compensation drain electrode D3 of the compensation TFT T3 is connected to the first storage plate Cst1 of the storage capacitor Cst, a first initialization drain electrode D4 of the first initialization TFT T4, and the driving gate electrode G1 of the driving TFT T1. The compensation TFT T3 is turned on in response to a scan signal Sn transferred via the scan line 121 and diode-connects the driving TFT T1 by electrically connecting the driving gate electrode G1 to the driving drain electrode D1 of the driving TFT T1.

A first initialization gate electrode G4 of the first initialization TFT T4 is connected to the previous scan line 122, a first initialization source electrode S4 of the first initialization TFT T4 is connected to a second initialization drain electrode D7 of the second initialization TFT T7 and the initialization voltage line 124, and a first initialization drain electrode D4 of the first initialization TFT T4 is connected to the first storage plate Cst1 of the storage capacitor, the compensation drain electrode D3 of the compensation TFT T3, and the driving gate electrode G1 of the driving TFT T1. The first initialization TFT T4 is turned on in response to a previous scan signal Sn−1 transferred via the previous scan line 122 and performs an initialization operation of initializing the voltage of the driving gate electrode G1 of the driving TFT T1 by transferring the initialization voltage Vint to the driving gate electrode G1 of the driving TFT T1.

An operation control gate electrode G5 of the operation control TFT T5 is connected to the emission control line 123, an operation control source electrode S5 of the operation control TFT T5 is connected to the driving voltage line 172, and an operation control drain electrode D5 of the operation control TFT T5 is connected to the driving source electrode S1 of the driving TFT T1 and the switching drain electrode D2 of the switching TFT T2.

An emission control gate electrode G6 of the emission control TFT T6 is connected to the emission control line 123, an emission control source electrode S6 of the emission control TFT T6 is connected to the driving drain electrode D1 of the driving TFT T1 and the compensation source electrode S3 of the compensation TFT T3, and an emission control drain electrode D6 of the emission control TFT T6 is electrically connected to the second initialization source electrode S7 of the second initialization TFT T7 and the pixel electrode of the OLED.

The operation control TFT T5 and the emission control TFT T6 are simultaneously turned on in response to an emission control signal En transferred via the emission control line 123 and allow the driving voltage ELVDD to be transferred to the OLED and the driving current $I_{OLED}$ to flow through the OLED.

A second initialization gate electrode G7 of the second initialization TFT T7 is connected to the previous scan line 122, a second initialization source electrode S7 of the second initialization TFT T7 is connected to the emission control drain electrode D6 of the emission control TFT T6 and the pixel electrode of the OLED, and a second initialization drain electrode D7 of the second initialization TFT T7 is connected to the first initialization source electrode S4 of the first initialization TFT T4 and the initialization voltage line 124. The second initialization TFT T7 is turned on in response to a previous scan signal Sn−1 transferred via the previous scan line 122 and initializes the OLED.

Although FIG. 2 illustrates that the first initialization TFT T4 and the second initialization TFT T7 are connected to the previous scan line 122, the embodiment is not limited thereto. In another embodiment, the first initialization TFT T4 may be connected to the previous scan line 122 and driven in response to a previous scan signal Sn−1, and the second initialization TFT T7 may be connected to a separate signal line (e.g. the next scan line) and driven in response to a signal transferred via the separate signal line.

A second storage plate Cst2 of the storage capacitor Cst is connected to the driving voltage line 172, and an opposite electrode of the OLED is connected to a common voltage ELVSS. Therefore, the OLED may display an image by receiving the driving current $I_{OLED}$ from the driving TFT T1 and emitting light.

Although FIG. 2 illustrates that the compensation TFT T3 and the first initialization TFT T4 have a dual gate electrode, the embodiment is not limited thereto. For example, the compensation TFT T3 and the first initialization TFT T4 may have a single gate electrode. Also, in addition to the compensation TFT T3 and the first initialization TFT T4, at least one of the other TFTs T1, T2, T5, T6, and T7 may have a dual gate electrode.

A specific operation of each pixel PX according to an embodiment is described below.

During an initialization period, when a previous scan signal Sn−1 is supplied via the previous scan line 122, the first initialization TFT T4 is turned on in response to the previous scan signal Sn−1, and the driving TFT T1 and an anode of the OLED are initialized by the initial voltage Vint supplied from the initialization voltage line 124.

During a data programming period, when a scan signal Sn is supplied via the scan line 121, the switching TFT T2 and the compensation TFT T3 are turned on in response to the scan signal Sn. In this case, the driving TFT T1 is diode-connected and forward biased by the turned-on compensation TFT T3.

Then, a compensation voltage Dm+Vth (Vth has a (−) value), which has been reduced by a threshold voltage Vth of the driving TFT T1 from a data signal Dm supplied via the data line 171, is applied to the driving gate electrode G1 of the driving TFT T1.

The driving voltage ELVDD and the compensation voltage Dm+Vth are applied to both ends of the storage capacitor Cst, and a charge corresponding to a voltage difference between both ends is stored in the storage capacitor Cst.

During an emission period, the operation control TFT T5 and the emission control TFT T6 are turned on in response to an emission control signal En supplied via the emission control line 123. Thereby, a driving current $I_{OLED}$ corresponding to a voltage difference between a voltage of the gate electrode of the driving TFT T1 and the driving voltage ELVDD is produced, and the driving current $I_{OLED}$ is supplied to the OLED via the emission control TFT T6.

Figure 3:
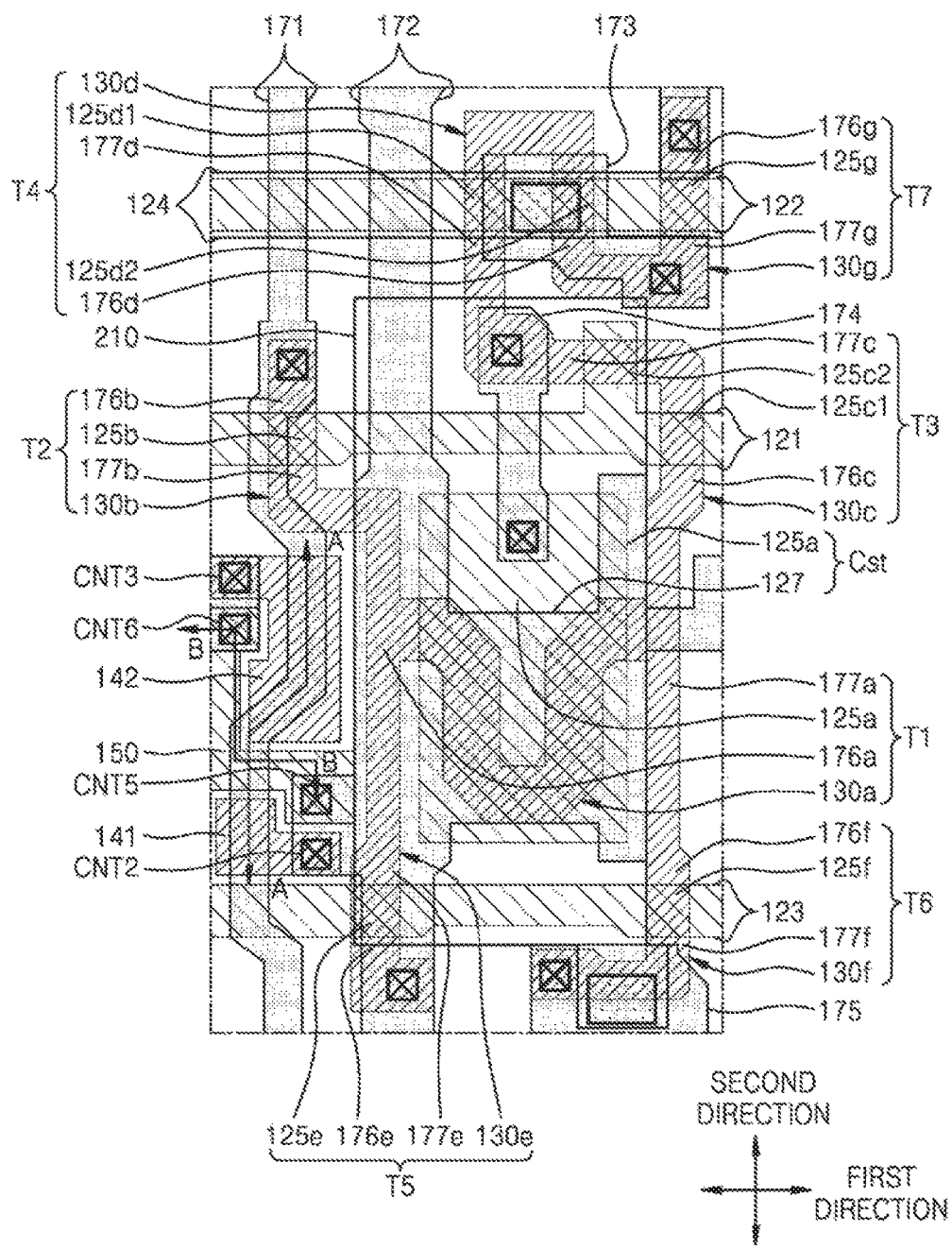
FIG. 3 is an layout view illustrating the locations of a plurality of thin film transistors, a storage capacitor, and a pixel electrode of the pixel of FIG. 2.
Figure 6:
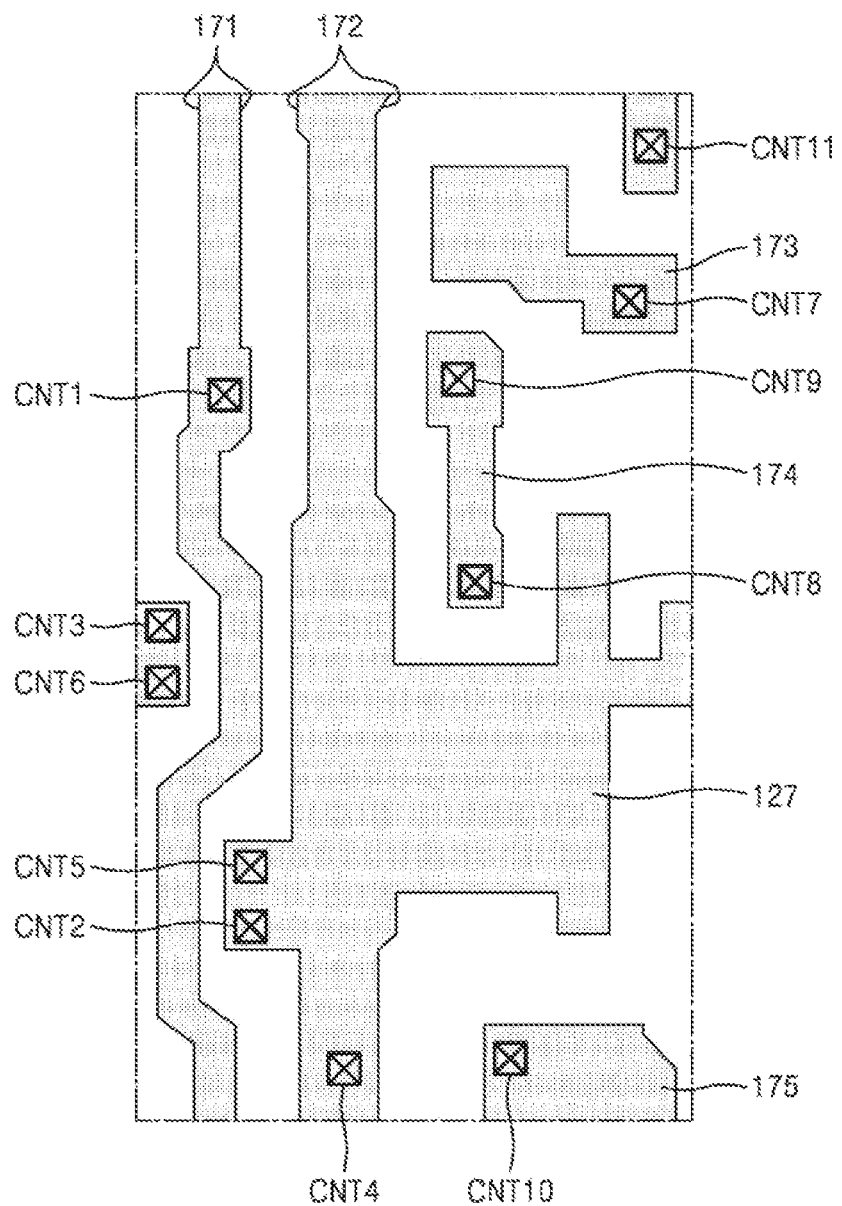
Figure 7:
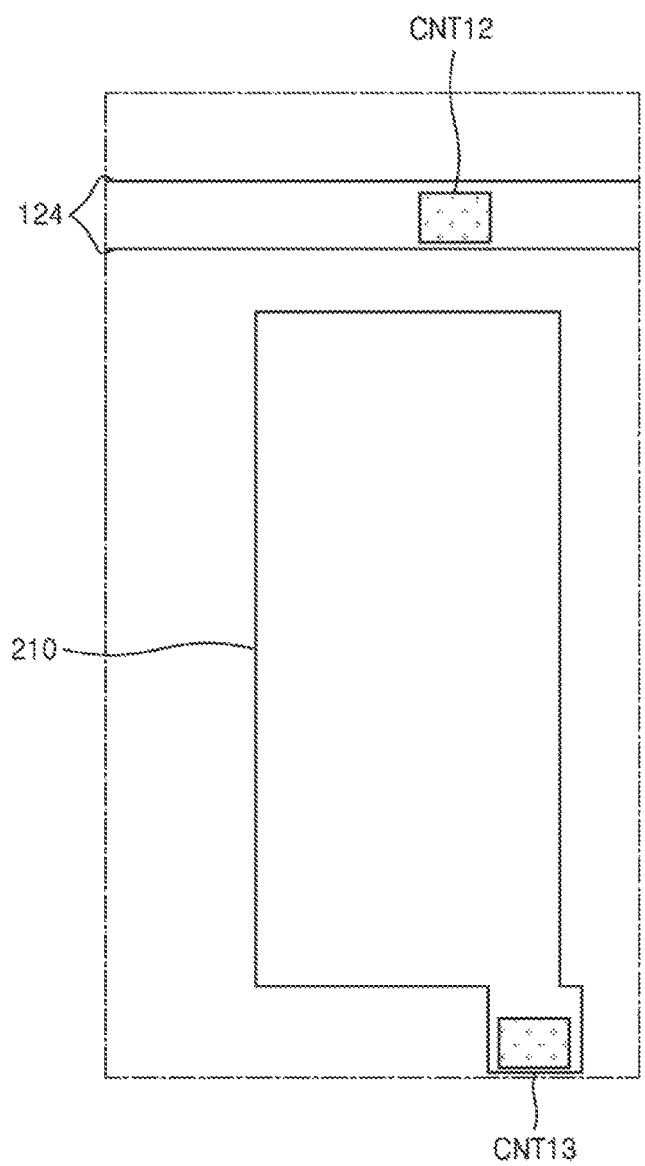
Figure 8:
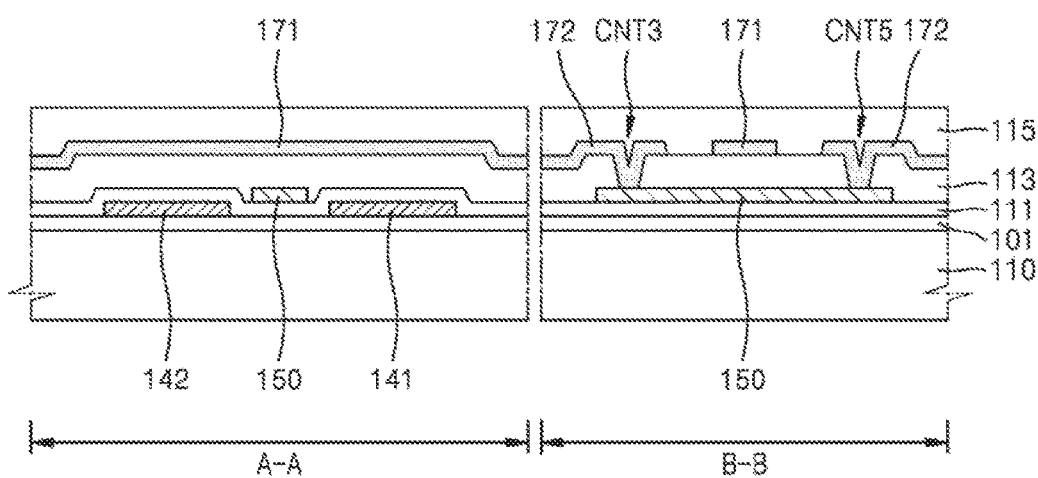
FIG. 8 is a cross-sectional view of the pixel taken along lines A-A and B-B of FIG. 3.

FIG. 3 is a view illustrating an arrangement of a plurality of thin film transistors, a storage capacitor, and a pixel electrode of the pixel of FIG. 2, FIGS. 4 to 7 are views illustrating arrangements of elements such as a plurality of thin film transistors, a storage capacitor, and a pixel electrode of the pixel illustrated in FIG. 3 according to layers, and FIG. 8 is a cross-sectional view of the pixel taken along lines A-A and B-B of FIG. 3.

Each of FIGS. 4 to 7 illustrates the arrangement of a wiring, an electrode, a semiconductor layer, etc. in the same layer. An insulating layer may be between layers illustrated in FIGS. 4 to 7. For example, a gate insulating layer 111 (see FIG. 8) may be disposed between a layer illustrated in FIG. 4 and a layer illustrated in FIG. 5. An interlayer insulating layer 113 (see FIG. 8) is disposed between the layer illustrated in FIG. 5 and a layer illustrated in FIG. 6. A planarization insulating layer 115 (see FIG. 8) is disposed between the layer illustrated in FIG. 6 and a layer illustrated in FIG. 7. The layers illustrated in FIGS. 4 to 7 may be electrically connected to each other via a contact hole in at least a portion of the above-mentioned insulating layers.

Referring to FIG. 3, a pixel PX includes the scan line 121, the previous scan line 122, the emission control line 123, and the initialization voltage line 124, each extending in a first direction and respectively applying a scan signal Sn, a previous scan signal Sn−1, an emission control signal En, and an initialization voltage Vint. Also, the pixel PX includes the data line 171 and the driving voltage line 172 extending in a second direction crossing the scan line 121, the previous scan line 122, the emission control line 123, and the initialization voltage line 124 and respectively applying a data signal Dm and a driving voltage ELVDD. Also, the pixel PX includes the TFTs T1 to T7, the storage capacitor Cst, and the OLED (see FIG. 2) electrically connected to the TFTs T1 to T7 and the storage capacitor Cst. Hereinafter, for convenience of description, description is made according to a stacking order.

Figure 4:
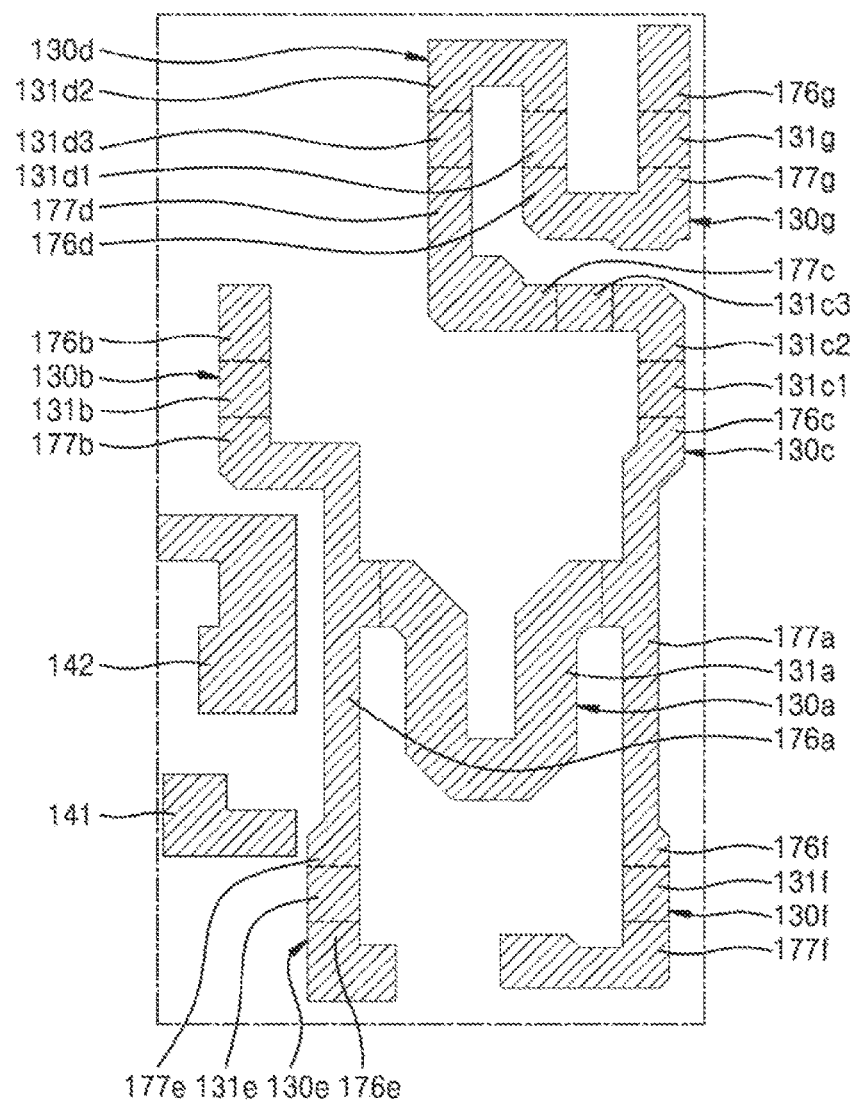
FIGS. 4, 5, 6 and 7 are views illustrating the arrangement of elements such as a plurality of thin film transistors, a storage capacitor, and a pixel electrode of the pixel illustrated in FIG. 3 according to layers.

Referring to FIGS. 3, 4, and 8, semiconductor layers 130a to 130g of the driving TFT T1, the switching TFT T2, the compensation TFT T3, the first initialization TFT T4, the operation control TFT T5, the emission control TFT T6, and the second initialization TFT T7, respectively; a first shielding layer 141; and a second shielding layer 142 are arranged in the same layer and include the same material. For example, the semiconductor layers 130a to 130g, the first shielding layer 141, and the second shielding layer 142 may include polycrystalline silicon.

The driving semiconductor layers 130a to 130g are arranged over a buffer layer 101 (see FIG. 8) on the substrate 110. The substrate 110 may include a glass material, a metallic material, and a plastic material such as polyethylene terephthalate (PET), polyethylene naphthalate (PEN), and polyimide, etc. The buffer layer 101 may include an oxide layer such as SiOx and/or a nitride layer such as SiNx.

The driving semiconductor layer 130a of the driving TFT T1, the switching semiconductor layer 130b of the switching TFT T2, the compensation semiconductor layer 130c of the compensation TFT T3, the first initialization semiconductor layer 130d of the first initialization TFT T4, the operation control semiconductor layer 130e of the operation control TFT T5, the emission control semiconductor layer 130f of the emission control TFT T6, and the second initialization semiconductor layer 130g of the second initialization TFT T7 may be connected to each other and curved in various shapes.

The semiconductor layers 130a to 130g may include a channel region, a source region and a drain region in both sides of the channel region. As an example, the source region and the drain region may be doped with impurities, and the impurities may include N-type impurities or P-type impurities depending upon a type of the TFT. The source region and the drain region may respectively correspond to a source electrode and a drain electrode. Hereinafter, terms such as a source region and a drain region are used instead of a source electrode and a drain electrode.

The driving semiconductor layer 130a includes a driving channel region 131a, a driving source region 176a and a driving drain region 177a respectively disposed at opposite sides of the driving channel region 131a. The driving channel region 131a may be longer than the other channel regions 131b to 131g. For example, the driving semiconductor layer 131a has a shape, like omega or a letter "S", bent a plurality of times, to thereby have a long channel length in a narrow space. Since the driving channel region 131a is long, a driving range of a gate voltage applied to a driving gate electrode 125a widens and thus a gray scale of light emitted from the OLED may be controlled more accurately and, thus, display quality of the OLED may improve.

The first and second shielding layers 141 and 142 are disposed adjacent to the driving gate electrode 125a. The first and second shielding layers 141 and 142 are spaced a predetermined distance apart from each other in a second direction. The predetermined distance may be determined considering a width of the connection line 150 disposed between the first shielding layer 141 and the second shielding layer 142. For example, the predetermined distance may be greater than the width of the connection line 150. The first and second shielding layers 141 and 142 may be doped with N-type or P-type impurities depending upon a type of the TFT. For example, the first and second shielding layers 141 and 142 are polycrystalline silicon layers doped with impurities. The first and second shielding layers 141 and 142 may be simultaneously doped when a source region and a drain region of the semiconductor layers 130a to 130g are doped. The first and second shielding layers 141 and 142 may have an island shape.

The switching semiconductor layer 130b includes a switching channel region 131b, a switching source region 176b and a switching drain region 177b respectively disposed at opposite sides of the switching channel region 131b. The switching drain region 177b is connected to the driving source region 176a.

The compensation semiconductor layer 130c includes compensation channel regions 131c1 and 131c3, and a compensation source region 176c and a compensation drain region 177c each respectively disposed at a side of the compensation channel regions 131c1 and 131c3. The compensation TFTs T3 of the compensation semiconductor layer 130c are dual TFTs having two compensation channel regions 131c1 and 131c3. A region 131c2 between the compensation channel regions 131c1 and 131c3 is a region doped with impurities, and serves as a source region of one of the dual TFT's and a drain region of the other of the dual TFTs at the same time.

The first initialization semiconductor layer 130d includes first initialization channel regions 131d1 and 131d3, a first initialization source region 176d and a first initialization drain region 177d each respectively disposed at a side of the first initialization channel regions 131d1 and 131d3. The first initialization TFTs T4 of the first initialization semiconductor layer 130d are dual TFTs and have two first initialization channel regions 131d1 and 131d3. A region 131d2 between the first initialization channel regions 131d1 and 131d3 is a region doped with impurities, and serves as a source region of tone of the dual TFT's and a drain region of the other of the dual TFTs at the same time.

The operation control semiconductor layer 130e includes an operation control channel region 131e, and an operation control source region 176e and an operation control drain region 177e respectively disposed at opposite sides of the operation control channel region 131e. The operation control drain region 177e may be connected to the driving source region 176a.

The emission control semiconductor layer 130f includes an emission control channel region 131f, and an emission control source region 176f and an emission control drain region 177f respectively disposed at opposite sides of the emission control channel region 131f. The emission control source region 176f may be connected to the driving drain region 177a.

The second initialization semiconductor layer 130g includes a second initialization channel region 131g, a second initialization source region 176g and a second initialization drain region 177g respectively disposed at opposite sides of the second initialization source region 131g.

The first gate insulating layer 111 is disposed on the semiconductor layers 130a to 130g, the first shielding layer 141 and the second shielding layer 142. The first gate insulating layer 111 may include an inorganic material including an oxide or a nitride. For example, the first gate insulating layer 111 may include $SiO_2$, SiNx, SiON, $Al_2O_3$, $TiO_2$, $Ta_2O_5$, $HfO_2$, $ZnO_2$, etc.

Figure 5:
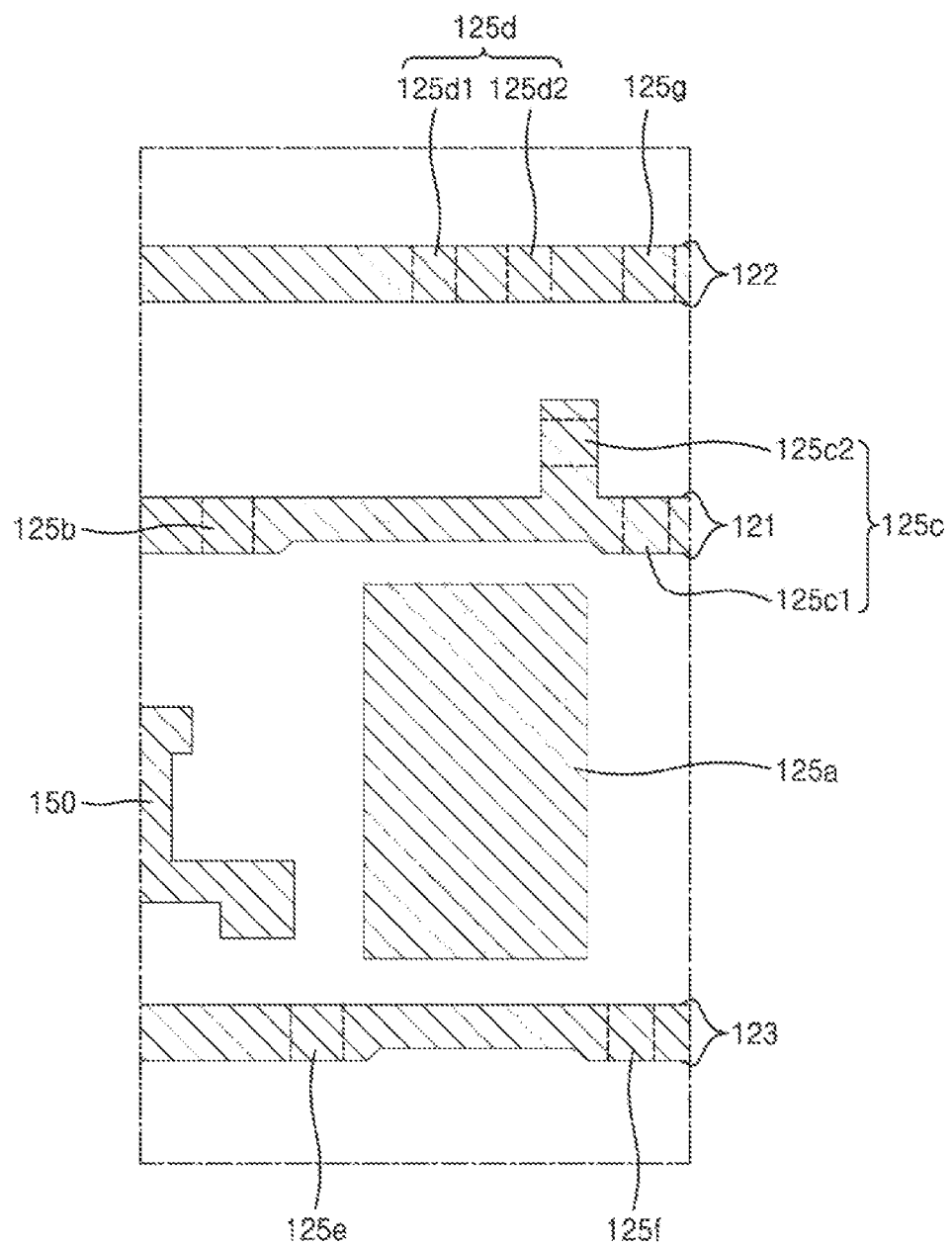

Referring to FIGS. 3, 5, and 8, the scan line 121, the previous scan line 122, the emission control line 123, the driving gate electrode 125a, and a connection line 150 are arranged over the first gate insulating layer 111. The scan line 121, the previous scan line 122, the emission control line 123, the driving gate electrode 125a, and the connection line 150 are arranged in the same layer and include the same material. For example, the scan line 121, the previous scan line 122, the emission control line 123, the driving gate electrode 125a, and the connection line 150 include Mo, Al, Cu, Ti, etc. and include a single layer or multiple layers.

The driving gate electrode 125a is an island type electrode that overlaps the driving channel region 130c of the driving semiconductor layer 130a. The driving gate electrode 125a may perform a function of a first electrode of the storage capacitor Cst, which is a first storage plate of the storage capacitor Cst, as well as a function of the gate electrode of the driving TFT T1. That is, the driving gate electrode 125a and the first electrode 125a of the storage capacitor Cst may be one body.

A portion or a protruding portion of the scan line 121, the previous scan line 122, and the emission control line 123 serves as the gate electrodes of the TFTs T2 to T7.

Regions of the scan line 121 overlapping the switching channel region 131lb and the compensation channel regions 131c1 and 131c3 respectively correspond to the switching gate electrode 125b and the compensation gate electrodes 125c1 and 125c3. Regions of the previous scan line 122 overlapping the first initialization channel regions 131d1 and 131d3 and the second initialization channel region 131g respectively correspond to the first initialization gate electrodes 125d1 and 125d2, and the second initialization gate electrode 125g. Regions of the emission control line 123 overlapping the operation control channel region 131e and the emission control channel region 125f respectively correspond to the operation control gate electrode 125e and the emission control gate electrode 125f.

The compensation gate electrodes 125c1 and 125c2 are dual gate electrodes including the first compensation gate electrode 125c1 and the second compensation gate electrode 125c2 and may prevent and reduce the occurrence of a leakage current.

The connection line 150 extends approximately in the first direction and disposed at a gap between the first and second shielding layers 141 and 142. In an embodiment, the connection line 150 which may be bent and extend to cross the data line 171. One end of the connection line 150 is disposed on the left of the data line 171 and another end of the connection line 150 is disposed on the right of the data line 171. The connection line 150 does not overlap the first and second shielding layers 141 and 142.

The interlayer insulating layer 113 is disposed over the scan line 121, the previous scan line 122, the emission control line 123, the first electrode layer 125a, and the connection line 150. The interlayer insulating layer 113 may include an inorganic material including an oxide or a nitride. For example, the interlayer insulating layer 113 may include $SiO_2$, SiNx, SiON, $Al_2O_3$, $TiO_2$, $Ta_2O_5$, $HfO_2$, $ZnO_2$, etc.

Referring to FIGS. 3, 6, and 8, the data line 171, the driving voltage line 172, an initialization connection line 173, a second electrode 127 of the storage capacitor Cst, a node connection line 174, and an intermediate connection layer 175 are disposed over the interlayer insulating layer 113.

The data line 171, the driving voltage line 172, the second electrode 127 of the storage capacitor Cst, the initialization connection line 173, the node connection line 174, and the intermediate connection layer 175 are arranged in the same layer and include the same material. For example, the data line 171, the driving voltage line 172, the second electrode 127 of the storage capacitor Cst, the initialization connection line 173, the node connection line 174, and the intermediate connection layer 175 may include a conductive material including Mo, Al, Cu, Ti, etc. and may include a single layer or multiple layers including the above-mentioned material. For example, the data line 171, the driving voltage line 172, the second electrode 127 of the storage capacitor Cst, the initialization connection line 173, the node connection line 174, and the intermediate connection layer 175 may include a multi-layered structure of Ti/Al/Ti.

The data line 171 extends in the second direction and is connected to the switching source region 176b of the switching TFT T2 via a contact hole cnt1 formed through the interlayer insulating layer 113.

A portion of the data line 171, for example, a portion of the data line 171 adjacent to the driving gate electrode 125a overlaps the first and second shielding layers 141 and 142. Parasitic capacitance generated between the data line 171 and the driving gate electrode 125a when a signal of the data line 171 is changed may be reduced and crosstalk by the parasitic capacitance may be prevented or reduced by the first and second shielding layers 141 and 142 to which a constant voltage is applied.

The first and second shielding layers 141 and 142 may be electrically connected to a wiring of a constant voltage, for example, the driving voltage line 172 providing the driving voltage ELVDD. In an embodiment, the first and second shielding layers 141 and 142 may be respectively connected to the driving voltage line 172 of a relevant pixel PX and the driving voltage line 172 of an adjacent pixel PX via contact holes cnt2 and cnt3.

The driving voltage line 172 extends in the second direction and is connected to an operation control source region 176e of the operation control TFT T5 via a contact hole cnt4 formed through the interlayer insulating layer 113.

As described above, the driving voltage line 172 may be connected to the first and second shielding layers 141 and 142 via the contact holes cnt2 and cnt3 formed through the interlayer insulating layer 113. Also, the driving voltage line 172 may be electrically connected to the connection line 150 via contact holes cnt5 and cnt6 formed through the interlayer insulating layer 113. In other words, the connection line 150 may be electrically connected to the driving voltage line 172 of a relevant pixel PX via the contact hole cnt5 and may be electrically connected to the driving voltage line 172 of an adjacent pixel PX via the contact hole cnt6. The driving voltage line 172 of the adjacent pixels PX and the connection line 150 may form a mesh structure and prevent a voltage drop of the driving voltage line 172.

The second electrode 127 of the storage capacitor Cst may be disposed on the same layer as that of the driving voltage line 172 and include the same material as that of the driving voltage line 172. In an embodiment, the second electrode 127 of the storage capacitor Cst and the driving voltage line 172 may be one body. In other words, a portion of the driving voltage line 172 extending in the first direction may be the second electrode 127 of the storage capacitor Cst.

The initialization connection line 173 transfers the initialization voltage Vint initializing the driving TFT T1 and a pixel electrode 210. The initialization connection line 173 is connected to the first and second initialization TFTs T4 and T7 and the initialization voltage line 124, which will be described below with reference to FIG. 7, via a contact hole cnt7 formed through the interlayer insulating layer 113.

The node connection line 174 connects the driving gate electrode 125a to the compensation drain region 177c of the compensation TFT T3 via contact holes cnt8 and cnt9. The island-type driving gate electrode 125a may be electrically connected to the compensation TFT T3 via the node connection line 174.

The intermediate connection layer 175 is connected to the emission control TFT T6 via a contact hole cnt10. For example, the intermediate connection layer 175 may be connected to the emission control drain region 177f of the emission control TFT T6. The intermediate connection layer 175 may be connected to the second initialization source region 176g of the second initialization TFT T7 via a contact hole cnt11.

The planarization insulating layer 115 is disposed over the data line 171, the driving voltage line 172, the second electrode 127 of the storage capacitor Cst, the initialization connection line 173, the node connection line 174, and the intermediate connection layer 175. The planarization insulating layer 115 may include an organic material such as benzocyclobutene (BCB), polyimide, or hexamethyldisiloxane (HMDSO), etc. Alternatively, the planarization insulating layer 115 may include an inorganic material.

Referring to FIGS. 3, 7 and 8, the initialization voltage line 124 and the pixel electrode 210 are disposed over the planarization insulating layer 115. The initialization voltage line 124 and the pixel electrode 210 are arranged in the same layer and include the same material.

The initialization voltage line 124 is connected to the initialization connection line 173 via a contact hole cnt12 formed through the planarization insulating layer 115 and is connected to the first and second initialization TFTs T4 and T7 by the initialization connection line 173.

The pixel electrode 210 is connected to the intermediate connection layer 175 via a contact hole cnt13 formed through the planarization insulating layer 115. The pixel electrode 210 is connected to the emission control drain region 177f of the emission control TFT T6 by the auxiliary connection layer 179 and the intermediate connection layer 175.

The pixel electrode 210 may be a reflective electrode. For example, the pixel electrode 210 may include a reflective layer including at least one of Ag, Mg, Al, Pt, Pd, Au, Ni, Nd, Ir, Cr, and a compound thereof, and a transparent or semi-transparent electrode layer over the reflective layer. The transparent or semi-transparent electrode layer may include at least one of indium tin oxide (ITO), indium zinc oxide (IZO), zinc oxide (ZnO), $In_2O_3$, indium gallium oxide (IGO), and aluminum zinc oxide (AZO).

Although not shown, an emission layer including an organic material including a fluorescent or phosphorescent material emitting red, green, blue, or white light is disposed over the pixel electrode 210. The emission layer may include a low molecular organic material or a polymer material. A functional layer such as a hole transport layer (HTL), a hole injection layer (HIL), an electron transport layer (ETL), and an electron injection layer (EIL) may be selectively further arranged over and below the emission layer.

An opposite electrode (not shown) may be disposed over the emission layer. The opposite electrode may be a transparent electrode. For example, the opposite electrode may be a transparent or semi-transparent electrode and may include a metallic thin layer having a small work function and including at least one of Li, Ca, LiF/Ca, LiF/Al, Al, Ag, Mg, and a compound thereof. Also, a transparent conductive oxide (TCO) such as ITO, IZO, ZnO, or $In_2O_3$ may be further arranged over the metallic thin layer.

Figure 9:
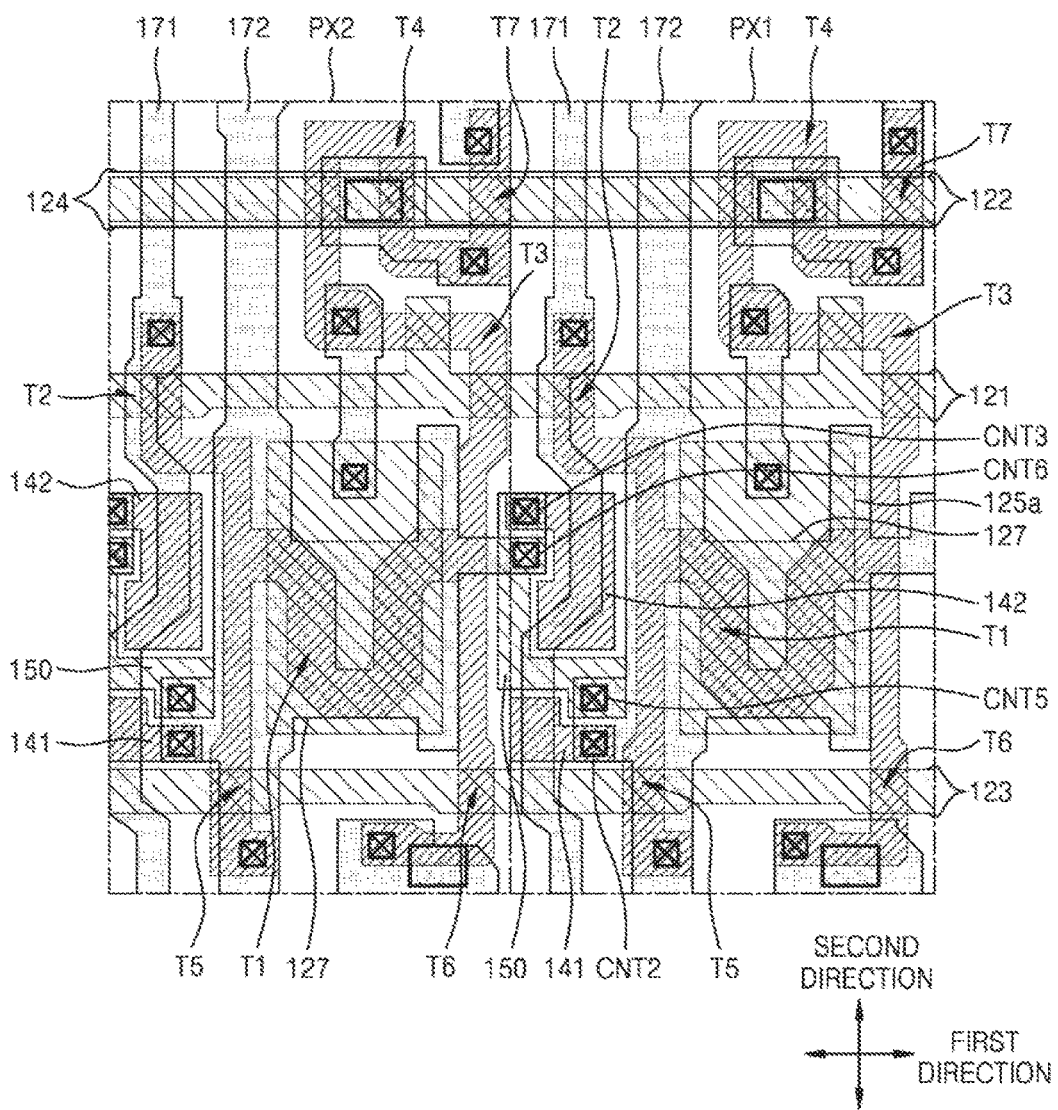
FIG. 9 is a plan view of two adjacent pixels of a display device according to an embodiment.

FIG. 9 is a plan view of two adjacent pixels of a display device according to an embodiment. Hereinafter, for convenience of description, one of the two adjacent pixels is referred to as a first pixel PX1 and the other of the two adjacent pixels is referred to as a second pixel PX2. For convenience of description, the pixel electrode 210 (see FIG. 3) has been omitted in FIG. 9.

Referring to FIG. 9, the first and second shielding layers 141 and 142 overlap the data line 171 extending in the second direction in the first pixel PX1. Both the first and second shielding layers 141 and 142 are island type layers and may be polysilicon layers doped with N-type or P-type impurities.

The first and second shielding layers 141 and 142 are electrically connected to the driving voltage line 172 of the first pixel PX1 and the driving voltage line 172 of the second pixel PX2, respectively, and receive the driving voltage ELVDD, which is a constant voltage. For example, the first shielding layer 141 is electrically connected to the driving voltage line 172 of the first pixel PX1 via the contact hole cnt2, and the second shielding layer 142 is electrically connected to the driving voltage line 172 of the second pixel PX2 via the contact hole cnt3. The first and second shielding layers 141 and 142 to which the constant voltage is applied may overlap the data line 171 and suppress the occurrence of crosstalk by a signal change of the data line 171. The first and second shielding layers 141 and 142 may completely overlap the data line 171 along the first direction.

The connection line 150 extends approximately in the first direction and disposed at a gap between the first and second shielding layers 141 and 142, and one end of the connection line 150 is connected to the driving voltage line 172 of the first pixel PX1 via the contact hole cnt5 and connected to the driving voltage line 172 of the second pixel PX2 via the contact hole cnt6 so as to form a mesh structure. A voltage drop of the driving voltage line 172 may be prevented via the net structure.

The connection line 150 does not overlap the first and second shielding layers 141 and 142. According to an embodiment, the semiconductor layers 130a to 130g and the first and second shielding layers 141 and 142 are formed as illustrated in FIG. 4; the signal lines 121, 122, and 123, the connection line 150, and the driving gate electrode 125a are formed as illustrated in FIG. 5; and the semiconductor layers 130a to 130g and the first and second shielding layers 141 and 142 are doped with impurities. During the doping, the signal lines 121, 122, and 123, the connection line 150, and the driving gate electrode 125a may be used as self-aligned masks.

As a comparative example, if the first shielding layer 141 is connected to the second shielding layer 142, an unintended TFT may be formed by the doping process. For example, while a portion (a connection portion of the first and second shielding layers) overlapping the connection line 150 becomes a channel region, one of the first and second shielding layers 141 and 142 becomes a source region and the other becomes a drain region. The unintended TFT hinders application of a data voltage of the data line 171.

However, according to an embodiment, since the first and second shielding layers 141 and 142 are spaced apart in the second direction such that a gap is formed therebetween, and the connection line 150 does not overlap the first and second shielding layers 141 and 142, the forming of the unintended TFT may be prevented.

According to the present embodiment, the driving voltage line 172 and the second electrode 127 of the storage capacitor Cst are provided as one body and, according to a plan view, the second electrode 127 may be disposed between the driving voltage line 172 and the first or second shielding layer 141 or 142, and between the driving voltage line 172 and the connection line 150. That is, the first shielding layer 141 may be directly connected to the driving voltage line 172 of the first pixel PX1 via the contact hole cnt2, and the second shielding layer 142 may be connected to the second electrode 127 via the contact hole cnt3 in one side of the second electrode 127 of the second pixel PX2 and may be electrically connected to the driving voltage line 172 via the second electrode 127.

Figure 10:
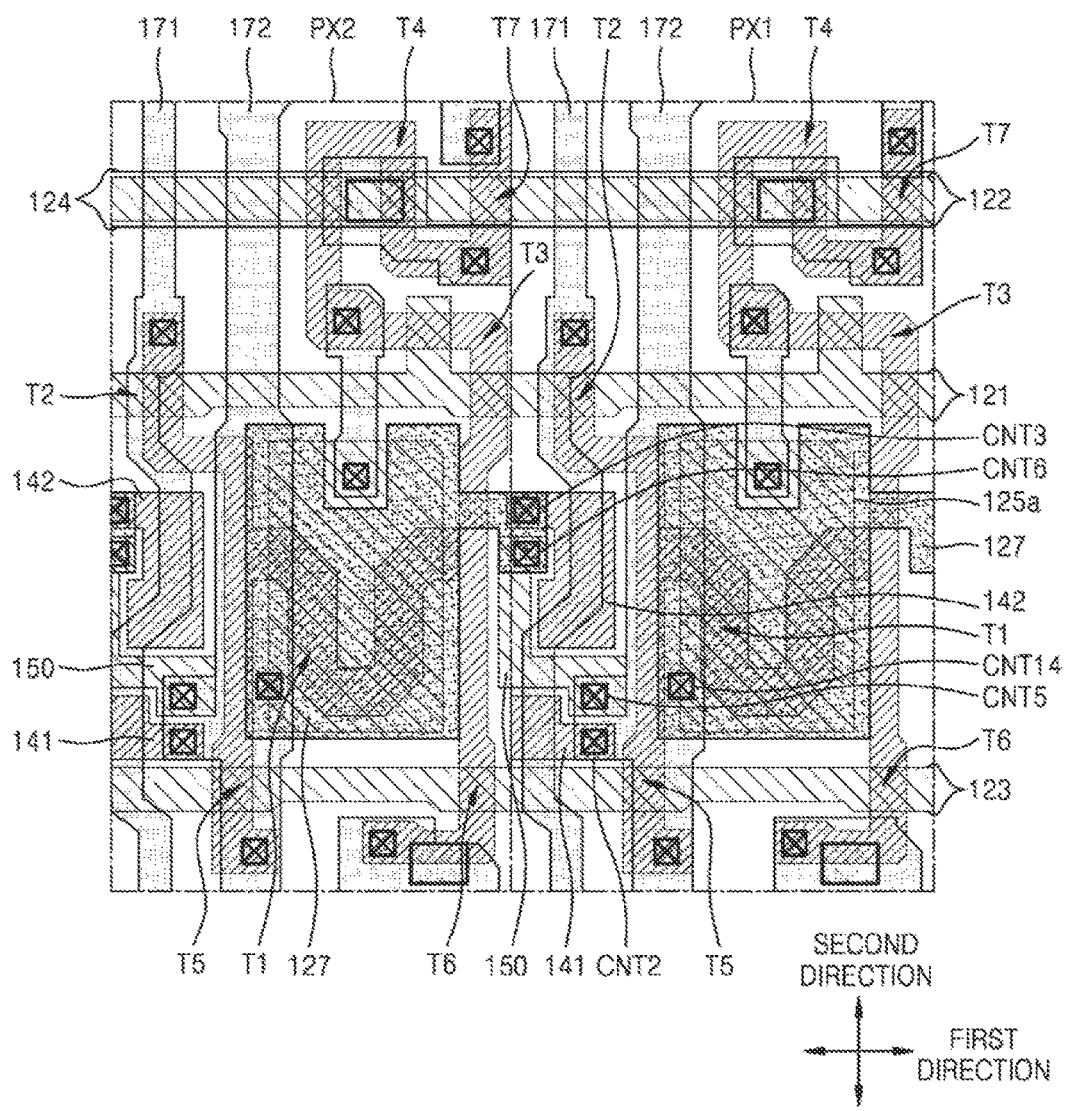
FIG. 10 is a plan view of two adjacent pixels of a display device according to another embodiment.

FIG. 10 is a plan view of two adjacent pixels of a display device according to another embodiment. For convenience of description, a pixel electrode has been omitted in FIG. 10.

The display device according to an embodiment illustrated in FIG. 10 is substantially the same as the display device illustrated in FIG. 9 in that the TFTs T1 to T7 and the storage capacitor Cst are provided, the first shielding layer 141 is spaced apart from the second shielding layer 142, and the connection line 150 is disposed between the first and second shielding layers 141 and 142. However, the display device according to the embodiment illustrated in FIG. 10 is different from the display device according to the embodiment illustrated in FIG. 9 in that the driving voltage line 172 and the second electrode 127 of the storage capacitor Cst are provided as one body in FIG. 9 but the driving voltage line 172 and the second electrode 127 of the storage capacitor Cst are respectively provided in different layers in FIG. 10. Descriptions of the same elements are omitted and differences are mainly described.

Referring to FIG. 10, the driving voltage line 172 and the second electrode 127 of the storage capacitor Cst are each arranged in different layers. At least one insulating layer is disposed between the driving voltage line 172 and the second electrode 127. For example, the driving voltage line 172 is arranged over the above-mentioned at least one insulating layer, and the second electrode 127 is arranged below the above-mentioned at least one insulating layer. Also, the driving voltage line 172 may be connected to the second electrode 127 via a contact hole cnt14 formed through at least one insulating layer.

The first shielding layer 141 may be directly connected to the driving voltage line 172 of the first pixel PX1 via the contact hole cnt2, and the second shielding layer 142 may be connected to the second electrode 127 via the contact hole cnt3 in one side of the second electrode 127 of the second pixel PX2 and be electrically connected to the driving voltage line 172 connected to the second electrode 127.

Even in the embodiment illustrated in FIG. 10, the occurrence of crosstalk by a signal change of the data line is prevented and minimized by the first and second shielding layers 141 and 142 to which the driving voltage ELVDD is applied, and while a voltage drop of the driving voltage line 172 is prevented by the connection line 150 not overlapping the first and second shielding layers 141 and 142, the generation of an unintended TFT is prevented.

Though the disclosure has been described with reference to the embodiments illustrated in the drawings, this is merely exemplary and it will be understood by those of ordinary skill in the art that various changes in form and details and equivalents thereof may be made therein without departing from the spirit and scope of the disclosure as defined by the following claims.

What is claimed is:

1. A display device comprising a plurality of pixels, wherein a first pixel of the plurality of pixels comprises:
   a scan line extending in a first direction;
   a data line and a driving voltage line extending in a second direction crossing the first direction;
   a switching thin film transistor connected to the scan line and the data line, the switching thin film transistor including a switching semiconductor layer;
   a driving thin film transistor connected to the switching thin film transistor, the driving thin film transistor including a driving semiconductor layer;
   a first shielding layer overlapping the data line; and
   a second shielding layer overlapping the data line, the second shielding layer being spaced apart from the first shielding layer in the second direction such that the first shielding layer and the second shielding layer are spaced a predetermined distance apart from each other,
   wherein each of the first shielding layer and the second shielding layer comprises a same material as one of the switching semiconductor layer and the driving semiconductor layer.

2. The display device of claim 1, wherein the first shielding layer and the second shielding layer receive a constant voltage.

3. The display device of claim 1, wherein one of the first shielding layer and the second shielding layer is electrically connected to the driving voltage line of the first pixel, and the other of the first shielding layer and the second shielding layer is electrically connected to a driving voltage line of a second pixel adjacent to the first pixel.

4. The display device of claim 1, wherein the first shielding layer and the second shielding layer comprise a same material.

5. The display device of claim 1, wherein the first shielding layer and the second shielding layer are disposed below the data line with at least one insulating layer between the data line and the first shielding layer and the second shielding layer.

6. The display device of claim 1, wherein the
   driving semiconductor layer comprising a driving channel region, and a driving source region and a driving drain region each respectively disposed at opposite sides of the driving channel region; and
   a driving gate electrode overlapping the driving channel region.

7. The display device of claim 6, wherein the first shielding layer and the second shielding layer overlap a portion of the data line disposed adjacent to the driving gate electrode.

8. The display device of claim 6, wherein the first shielding layer and the second shielding layer comprise a same material as those of the driving source region and the driving drain region.

9. The display device of claim 8, wherein the first shielding layer and the second shielding layer are polycrystalline silicon layers doped with impurities.

10. A display device comprising a plurality of pixels, wherein a first pixel of the plurality of pixels comprises:
   a scan line extending in a first direction;
   a data line and a driving voltage line extending in a second direction crossing the first direction;
   a switching thin film transistor connected to the scan line and the data line;
   a driving thin film transistor connected to the switching thin film transistor;
   a first shielding layer overlapping the data line;
   a second shielding layer overlapping the data line, the second shielding layer being spaced apart from the first shielding layer in the second direction such that the first shielding layer and the second shielding layer are spaced a predetermined distance apart from each other; and:
   a connection line disposed between the first shielding layer and the second shielding layer, the connection line electrically connecting the driving voltage line of the first pixel to a driving voltage line of a second pixel adjacent to the first pixel.

11. The display device of claim 10, wherein the connection line is disposed below the data line with at least one insulating layer between the data line and the connection line.

12. The display device of claim 10, wherein the connection line does not overlap the first shielding layer and the second shielding layer.

13. The display device of claim 10, wherein the first pixel further comprises:
   a storage capacitor comprising a first electrode and a second electrode overlapping each other with an insulating layer disposed between the first electrode and the second electrode.

14. The display device of claim 13, wherein the connection line comprises a same material as that of at least one of a driving gate electrode of the driving thin film transistor and the first electrode.

15. The display device of claim 13, wherein the second electrode is disposed between the driving voltage line and the connection line such that one side of the second electrode is connected to the driving voltage line and the other side of the second electrode is connected to the connection line.

16. The display device of claim 15, wherein the driving voltage line and the second electrode are provided as one body.

17. The display device of claim 16, wherein the predetermined distance is greater than a width of the connection line.

18. The display device of claim 1, wherein the first pixel comprises an organic light-emitting diode electrically connected to the driving thin film transistor.

* * * * *